(12) United States Patent
Shishido et al.

(10) Patent No.: US 6,294,831 B1
(45) Date of Patent: Sep. 25, 2001

(54) ELECTRONIC PACKAGE WITH BONDED STRUCTURE AND METHOD OF MAKING

(75) Inventors: Itsuroh Shishido; Toshihiro Matsumoto, both of Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/429,154

(22) Filed: Oct. 28, 1999

(30) Foreign Application Priority Data

Nov. 5, 1998 (JP) .................................................. 10-313848

(51) Int. Cl.$^7$ .......................... H01L 23/06; H01L 23/22; H01L 23/34
(52) U.S. Cl. .......................... 257/729; 257/687; 257/704; 257/712; 257/730
(58) Field of Search ...................................... 257/795, 704, 257/710, 729, 730, 678, 687, 712

(56) References Cited

U.S. PATENT DOCUMENTS

| | | | |
|---|---|---|---|
| 5,178,962 | * 1/1993 | Miyamoto et al. | 428/463 |
| 5,324,888 | * 6/1994 | Tyler et al. | 174/52.2 |
| 5,473,191 | * 12/1995 | Tanaka | 257/680 |
| 5,473,512 | * 12/1995 | Degani et al. | 361/760 |
| 5,734,201 | * 3/1998 | Djennas et al. | 257/783 |
| 5,742,007 | * 4/1998 | Kornowski et al. | 174/52.3 |
| 5,789,810 | * 8/1998 | Gross et al. | 257/704 |
| 5,889,323 | * 3/1999 | Tachibana | 257/704 |
| 5,909,057 | * 6/1999 | McCormick et al. | 257/704 |

FOREIGN PATENT DOCUMENTS

| | | |
|---|---|---|
| 62-249429 | 10/1987 | (JP) . |
| PUPA04-291251 | 10/1992 | (JP) . |
| PUPA05-55300 | 3/1993 | (JP) . |
| PUPA05-206307 | 8/1993 | (JP) . |
| PUPA07-297325 | 11/1995 | (JP) . |
| PUPA11-340347 | 12/1999 | (JP) . |

OTHER PUBLICATIONS

Kotthaus et al., "Study of Isotropically Conductive Bondings Filled with Aggregates of Nano–Sized Ag–Particles", IEEE Trans. on Components, Packaging, and Manu. Tech., pp. 15–20, Mar. 1997.*

Wong et al., "Fast–Flow Underfill Encapsulant: Flow Rate and Coefficient of Thermal Expansion", IEEE Trans. on Components, Packaging, and Manu. Tech., pp. 360–364, Oct. 29–30, 1997.*

Schaefer et al. "Conductive Adhesives with Improved Thermomechanical Properties", Proceedings of 3rd International Conf. on Adhesive Joining and Coating Tech. in Elec. Manu., pp. 278–281, Sep. 28–30, 1998.*

* cited by examiner

Primary Examiner—Matthew Smith
Assistant Examiner—Lex H. Malsawma
(74) Attorney, Agent, or Firm—Lawrence R. Fraley

(57) ABSTRACT

An electronic package comprising a semiconductor chip mounted on a substrate is formed by bonding a structure which covers at least an outer surface of the semiconductor chip and has the same or about the same thermal expansion coefficient as the substrate to the semiconductor chip's side surface of the substrate. This reduces warp and deformation caused by temperature changes during package operation.

14 Claims, 6 Drawing Sheets

US 6,294,831 B1

ELECTRONIC PACKAGE WITH BONDED STRUCTURE AND METHOD OF MAKING

TECHNICAL FIELD

The present invention relates to semiconductor devices and more particularly to a prevention of warp thereof during operation within an electronic package.

BACKGROUND OF THE INVENTION

Conventionally, as shown in FIG. 10, underfill 4, a material with a high elastic coefficient, has been filled between a semiconductor chip 2 and an organic substrate 1 in a Ball Grid Array (BGA) module 3 designed for mounting a flip-chip-type semiconductor chip 2 on the organic substrate 1. Such modules are typically referred to in the art as electronic packages. Since the thermal expansion coefficient of the semiconductor chip 2 is not the same as that of the organic substrate 1, the semiconductor chip 1 and the organic substrate 2, between which underfill 4 is sandwiched, are thermally expanded or shrunk independently under a change in temperature.

Accordingly, the behavior of these structures differs according to thermal coefficients of expansion of the semiconductor chip 2 and the substrate 1. For example, as shown in the much exaggerated view in FIG. 11, the module 3 may be deformed because of a rise or drop in temperature. Consequently, a BGA solder joint of the assembled module 3 may break, such that faulty connections are generated, thus exerting an adverse effect on the product's reliability. For this reason, the development of an electronic package which is not as affected by a change in temperature is strongly desired.

Laid-Open Japanese Patent Publication No. 62-249429 describes a semiconductor package in which a semiconductor "pellet" is bonded to a substrate and capped by metal or ceramics. In this package, in order to improve the radiation of heat generated inside the semiconductor "pellet", heat transfer from the semiconductor "pellet" to the cap is increased by putting the upper surface of the semiconductor "pellet" into contact with the inner surface of the cap, or through the medium of a space-filled metal. However, this publication does not mention a poor bonding between a substrate and a semiconductor chip, which is generated by warpage or deformation of the substrate caused by the difference in thermal expansion coefficient between the substrate and the semiconductor chip.

DISCLOSURE OF THE INVENTION

A primary object of the present invention is to enhance the semiconductor art.

Another object of the present invention is to prevent defective connections between a semiconductor device and substrate by reducing warpage and deformation of such structures caused by a change in temperature (e.g., during product operation).

According to one aspect of the present invention, there is provided an electronic package comprising a substrate having a first surface, a semiconductor chip having an outer surface and mounted on the first surface of the substrate, and a structure substantially covering at least the outer surface of the semiconductor chip and having substantially the same coefficient of thermal expansion as the substrate, the structure being bonded to the first surface of the substrate.

According to another aspect of the invention, there is provided an electronic package comprising a substrate having a first surface, a semiconductor chip having an outer surface and mounted on the first surface of the substrate, and a structure having substantially the same coefficient of thermal expansion as the substrate and including an open portion covering at least the outer surface of the semiconductor chip, the structure being located on the first surface of the substrate and bonded to the substrate and the semiconductor chip by an adhesive material located within the hollow part of the structure.

According to another aspect of the invention, there is provided a method comprising providing a circuitized substrate having a first surface, positioning a semiconductor chip having an outer surface on the substrate and electrically coupling the semiconductor chip thereto, and positioning a structure having an open portion on the first surface of the substrate such that the open portion contacts the outer surface of the chip, the structure having substantially the same coefficient of thermal expansion as the substrate.

BRIEF DESCRIPTION OF THE DRAWINGS

FIG. 4(*b*) is a plan view each showing still another embodiment of the present invention.

FIG. 5(*b*) is a plan view each showing a further embodiment of the present invention.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from FIG. To FIG.

Referring now to the accompanying drawings, embodiments of an electronic package of the present invention are described in detail below.

Figure 1:
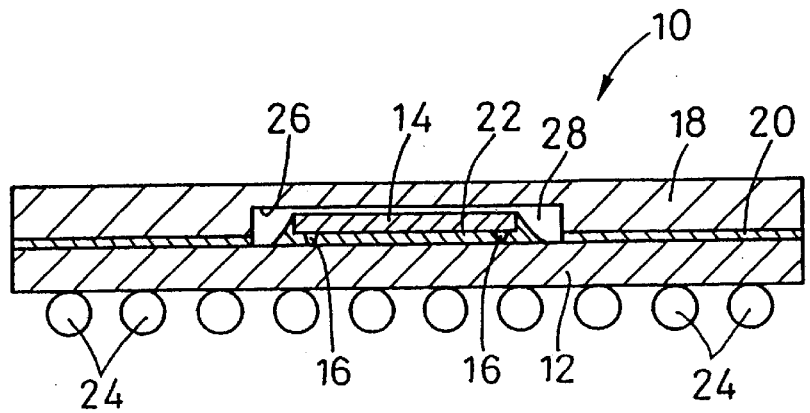
FIG. 1 is a sectional view showing one embodiment of an electronic package according to the present invention.

In electronic package 10 of the present invention, as shown in FIG. 1, a semiconductor chip 14 is mounted on the upper surface of a substrate 12 using solder "bumps" (balls) 16, and a thermally conductive structure 18, which substantially covers one side of substrate 12 (including semiconductor chip 14) and is bonded with adhesive agent 20 to the upper surface of the substrate (that on which the chip is located). Furthermore, underfill 22 is deposited between the substrate 12 and the semiconductor chip 14, and around solder bumps 24 (which are electrically connected to wiring by through holes (not shown)) formed in the substrate and having end portions terminating on the outer surface (e.g., with pads or lands) of substrate 12.

It is preferred to use an organic material for substrate 12. Known dielectric materials having high stiffness such as glass epoxy resin or the like may be used for substrate 12. On the upper surface of the substrate 12, conventional wiring (not shown) that is connected electrically to bumps 16 of the semiconductor chip is formed. Typically, such wiring comprises a pattern of metal (usually copper) thin lines which couple various pads, lands or the like.

It is preferable to use a flip-chip type semiconductor chip which can be mounted horizontally on the substrate 12 through bumps 16. A flip-chip is called this because its contact side is inverted during positioning and faces downward toward the awaiting substrate (e.g., printed circuit board, or PCB) on which it is finally positioned. It is further preferable that package 10 be a BGA module; however, the invention is not limited to only such packages. The underfill 22 positioned between substrate 12 and the conductor chip 14 mounted thereon is used to protect the bumps 16 during changes in temperature; therefore, such materials as epoxy materials comprising silica ($SiO_2$) and the like can be used as the material for this underfill.

Structure 18 includes an open (or hollow) portion 26 for accommodating the semiconductor chip 14 and substantially covering it when the structure is in final position on substrate 12. Open portion 26 includes space 28 as shown. The structure 18 is formed by using a material having substantially the same coefficient of thermal expansion (CTE) as substrate 12. For example, when known epoxy resin materials (known in the art as "FR4" material) which typically have a thermal expansion coefficient of $15 \times 10^{-6}$ (1/° C.) are used for the substrate, aluminum alloy with a relatively low linear expansion coefficient (thermal expansion coefficient of $16 \times 10^{-6}$ (1/° C.)), or a copper alloy (thermal expansion coefficient of $15 \times 10^{-6}$ (1/° C.)) can be used as the structure's material. The structure 18 is bonded to substrate 12 firmly with adhesive 20, so that any warpage caused by the differences in thermal expansion coefficient between semiconductor chip 14 and substrate 12 can be "controlled" (compensated for) by structure 18.

The CTE of structure 18 should be substantially similar to that of substrate 12; however, structure 18 is not to be so limited. Further, metal or metal alloy materials with high stiffness are used for structure 18. The structure 18 is located on substrate 12 by covering semiconductor chip 14; therefore, it is necessary that heat generated from semiconductor chip 14 be passed to the outside of structure 18. For this reason, structure 18 is preferably a material with excellent thermal conductivity. If of metal or metal alloy, structure 18 would possess both features (stiffness and heat transfer).

As apparent from the above embodiment of package 10 according to the present invention, when structure 18 has the same or about the same thermal expansion coefficient as substrate 12, even if the semiconductor device 10 is affected by a change in temperature from the outside or by the heat generated from the chip, package 10 is not warped as a whole because substrate 12 thermally expands and contracts in the same manner as structure 18. Therefore, effective bonding at the solder ball bumps is maintained and the reliability of these bonded packages is dramatically improved.

Figure 2:
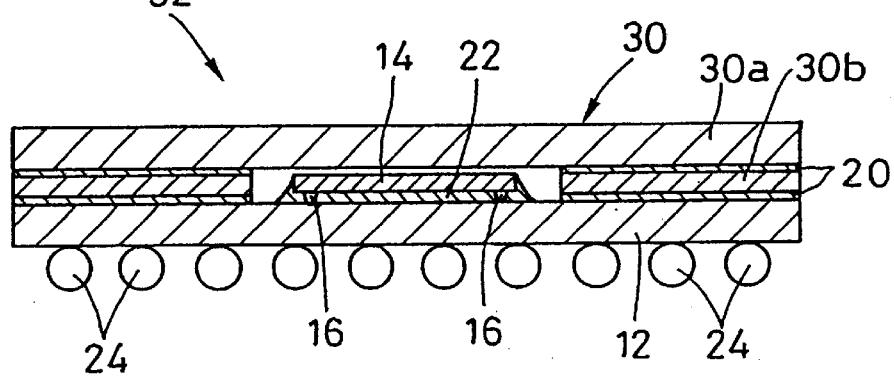
FIG. 2 is a sectional view showing another embodiment of the present invention.

As shown in FIG. 2, the substrate 12 of structure 30 is of substantially the same construction as the substrate in FIG. 1 (and preferably of similar material). In this embodiment, however, structure 30 includes a flat structure 30a, which is of nearly identical shape as substrate 12, in combination with spacing member(s) 30b to assure space for semiconductor chip 14. The flat member 30a and the spacing member(s) 30b are bonded to substrate 12 with adhesive 20. In such construction, since the structure 30 (of parts 30a and 30b) has the same thermal expansion coefficient as substrate 12, substantially no warpage will occur in the resulting package 32.

Figure 3:
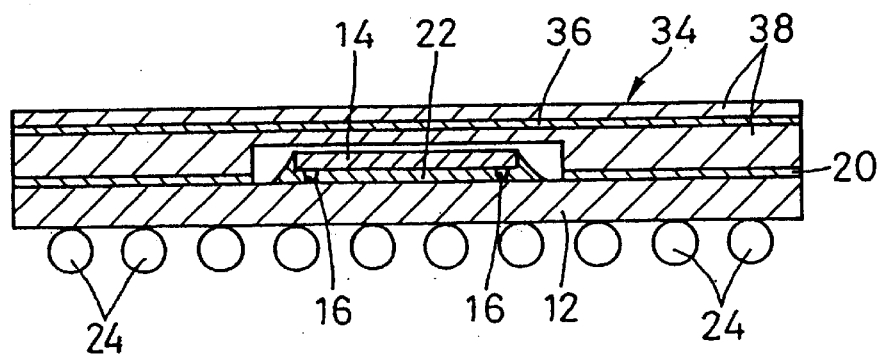
FIG. 3 is a sectional view showing a further embodiment of the present invention.

The structure which covers the semiconductor chip while mounted on the substrate 12, as shown in FIG. 3, can also be of a composite material comprising a layer 36 of film, sheet, mesh or linear member made of metal or metal alloy, and a synthetic resin layer 38. If there is no singular material for the structure that has substantially the same CTE as substrate 12, the structure 34 may be comprised of multiple materials, so that the CTE of these two components are substantially the same.

Further, structure 34 may be comprised of more layers of such materials than those illustrated in FIG. 3. Alternatively, structure 34 may also include a single layer for layer 36, wherein linear members made of metal or alloy are arranged lengthwise and crosswise, this then used in combination with the synthetic resin layer 38. Additionally, structure 34 can even be molded as such after fine powder of metal or alloy is mixed and kneaded with the synthetic resin. The synthetic resin used herein is not particularly limited to only one kind, but a mixture of several kinds of synthetic resins can be also used. In any case, it is preferable that the CTE of structure 34 be the same or about the same as that of the substrate 12.

Figure 4A:
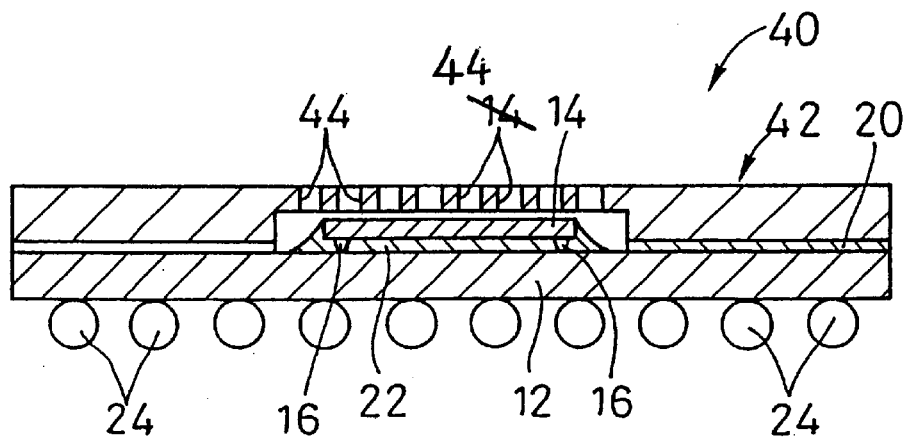
FIG. 4(*a*) is a section view.
Figure 4B:
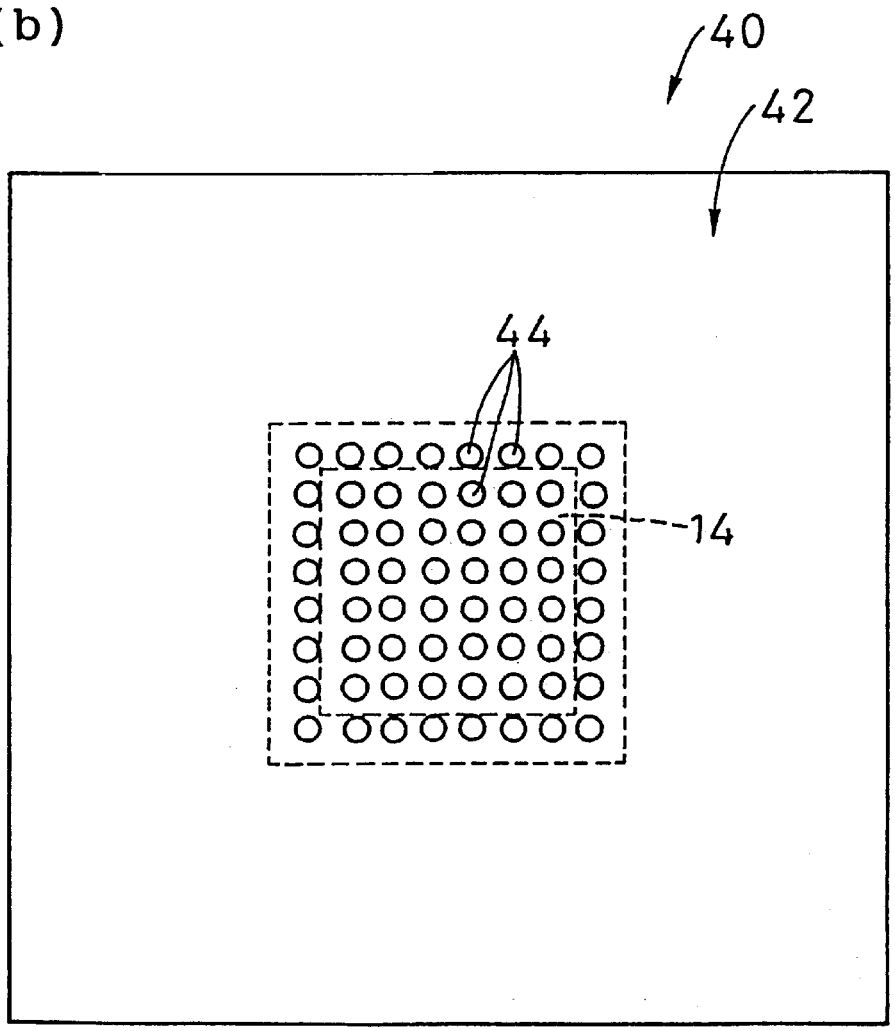

As shown in FIGS. 4(a) and 4(b), it is preferable that structure 42 of package 40 have multiple openings 44, at least on the area adjacent chip 14. By orienting the structure as shown, heat generated from semiconductor chip 14 will exit through openings 44 to the environment surrounding package 40. In this embodiment, structure 42 is not necessarily made of metal or alloy with high thermal conductivity, but it may be made of the same dielectric resin material as organic substrate 12. It is also possible to provide such multiple openings in the structures in FIGS. 1–3.

Figure 5A:
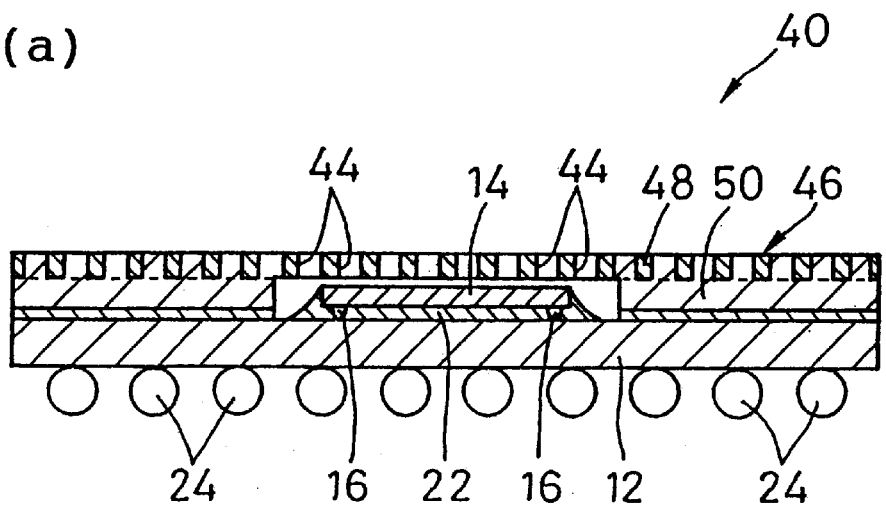
FIG. 5(*a*) is a sectional view.
Figure 5B:
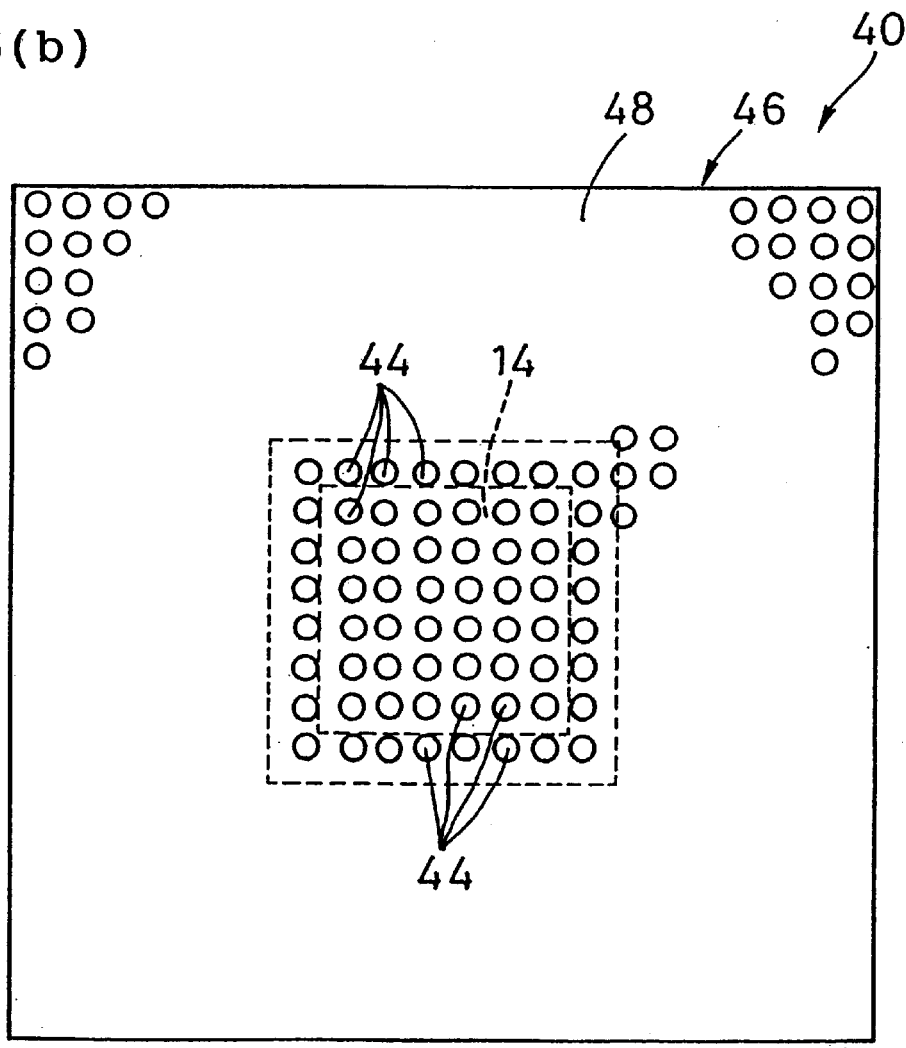

As shown in FIG. 5, in addition to openings 44, structure 46 may also include openings 48 at other locations therein, which openings 48 may be filled with synthetic resin 50. Such filled openings also possess substantially the same CTE as substrate 12. In such an embodiment, the same positive effects realized in the above embodiments can be obtained.

Openings 48 and 44 described above are not limited to having a round configuration as shown, but instead can each be of a rectangular, polygonal or oval shape, or various combinations thereof. In addition, these openings can be arranged in a grid, zigzag, or other pattern, thus not being particularly limited to the pattern shown in the drawings.

Figure 6:
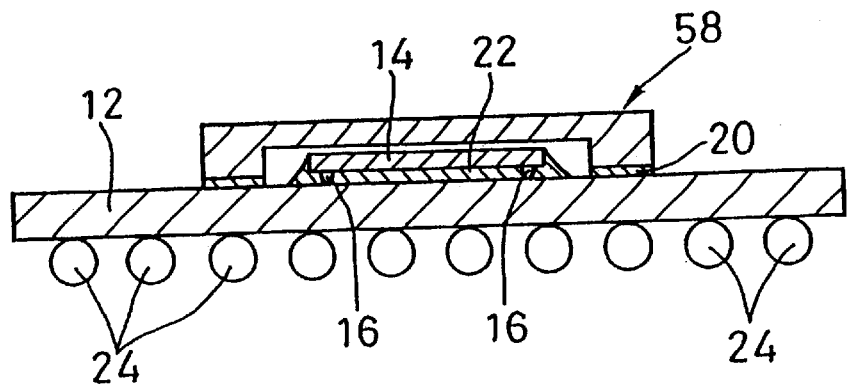
FIG. 6 is a sectional view showing another embodiment of the present invention.

As shown in FIG. 6, structure 58, while positioned on substrate's upper surface, does not necessarily cover the whole of said surface. For purposes of the invention, it is acceptable for the structure to cover only a part of the substrate while covering all of the semiconductor chip 14. Although slight warpage may occur at the bonded location of semiconductor chip 14 (due to the difference in CTEs between the chip and substrate), the uncovered part of the substrate does not warp. This combination assures minimal warpage, if any, at the bonding site which is tolerable for the present invention without causing bump disconnection.

Figure 7:
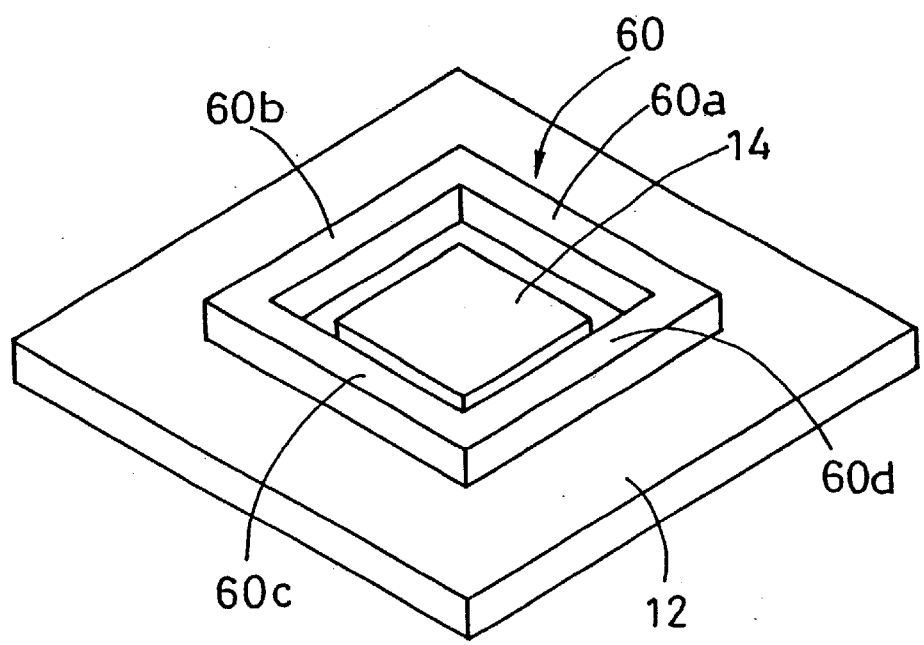
FIG. 7 is a perspective view showing still another embodiment of the present invention.

As shown in FIG. 7, structure 60 may only cover the surroundings of the semiconductor chip on substrate 12. In this case, it is preferable that structure 60 have the same or about the same CTE as substrate 12, and be resistant to bending. When members 60a and 60c of structure 60 expand in the direction of the length members 60b and 60d (which are normal to members 60a and 60c) this movement separates one from the others. At the same time, when members 60b and 60d expand in the length direction, members 60a and 60c also move in a direction that separates these members from each other. The same positive effects as in the above embodiments can be obtained in this embodiment.

Figure 8:
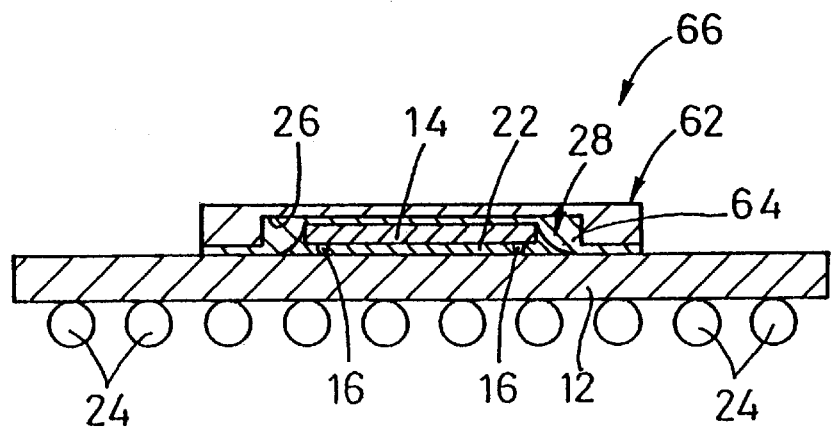
FIG. 8 is a sectional view showing a further embodiment of the present invention.

Next, as shown in FIG. 8, the semiconductor device can be formed by locating the structure 62 (which has the hollow part 26 covering at least the outer surface of the semiconductor chip and has the same or about the same CTE as structure 62) on the surface of substrate 12, filling adhesive material in the space 28 between hollow part 26 of structure 62 and the semiconductor device 14, and bonding the substrate 12 and the semiconductor chip to the structure. Positioning structure 62 results in the package getting thicker. For this reason, it is desirable to make structure 62 as thin as possible. However, should structure 62 become too thin, the strength of hollow part 26 also decreases. By filling adhesive material 64 in the spaces 28 between hollow part 26, the strength of the hollow part can be dramatically increased, allowing for such a package. Further, by filling with adhesive material in this manner, hermeticity and moisture-proofing of the package is assured.

Figure 9:
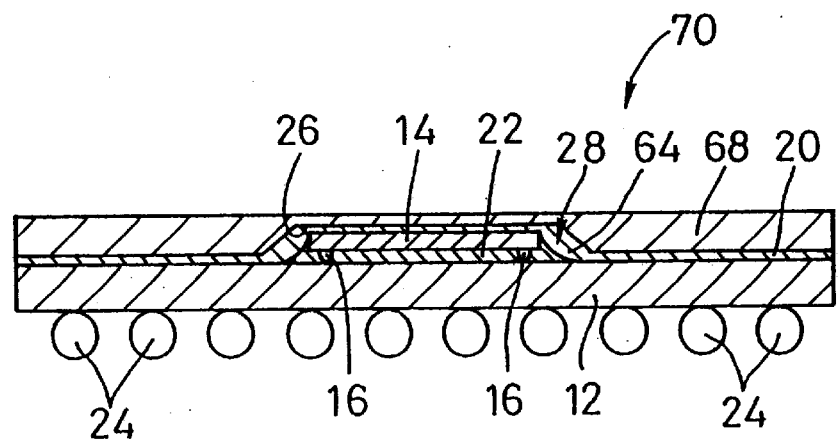
FIG. 9 is a sectional view showing a still further embodiment of the present invention.
Figure 10:
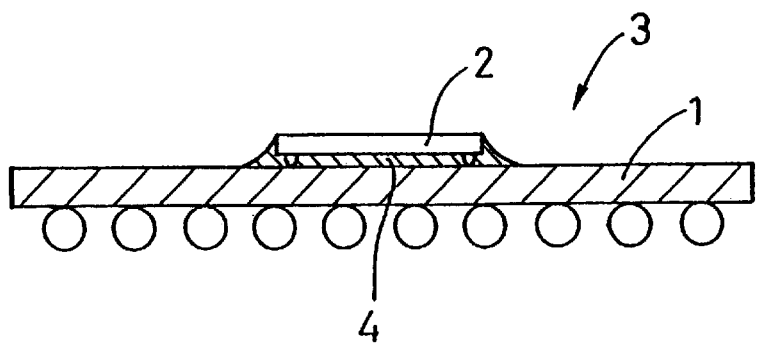
FIG. 10 is a sectional view showing a known electronic package.
Figure 11:
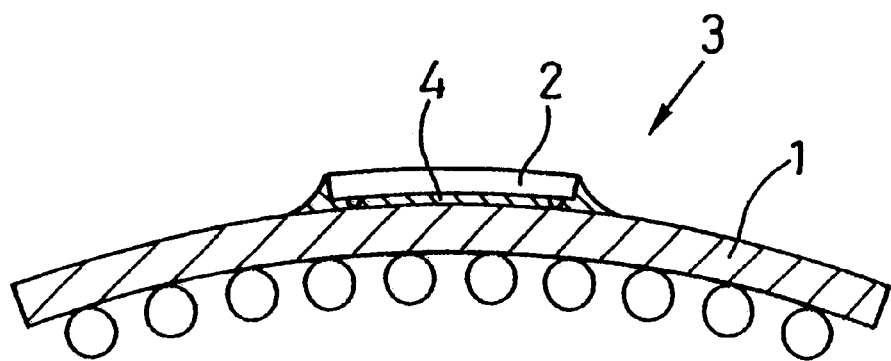
FIG. 11 is a sectional view showing warpage of the package of FIG. 10 during operation thereof.

Package 70 in FIG. 9 has a structure 68 as big as its substrate 12. By making structure 68 this big, the strength of the package is increased. Therefore, a package which prevents warpage can be achieved.

Furthermore, the resin used for underfill 22 (FIG. 1) can be used as the adhesive agent 64. Still further, the structures 62 and 68 are symmetrical about the semiconductor chip 14, to further assure very little, if any, warpage. It is preferable in such an arrangement that an adhesive material with high thermal conductivity be used for adhesive material 64. The heat generated from semiconductor chip 14 is mainly directed through structures 62 or 68 before passing externally of the package. For this reason, it is preferable that structures 62 or 68 be made of metal or metal alloy with high thermal conductivity. A simple resin or a mixture with resin and metal powder can be used as the adhesive material 64 for such structures; however, it is preferable to use an adhesive material with higher thermal conductivity.

Having described preferred embodiments of the electronic package according to the present invention, it should be understood that the present invention is not limited to the illustrated packages.

For example, if a flexible substrate is used, when such a substrate is bonded to the structure, residual tensile stresses in the substrate do not adversely affect the semiconductor chip and bonded part. By providing residual tensile stress to the substrate, even when the structure has slightly different thermal expansion coefficient from that of the substrate, no warpage occurs in the package because the residual tension stress absorbs the difference within the range of elongation.

Having described a BGA-type electronic package in the above embodiments, the package of the present invention may be the pin-type packages or similar such packages.

While there have been shown and described what are at present the preferred embodiments of the invention, it will be obvious to those skilled in the art that various changes and modifications may be made therein without departing from the scope of the invention as defined by the appended claims.

What is claimed is:

1. An electronic package comprising:
    an organic substrate having a first surface;
    a semiconductor chip having an outer surface, said semiconductor chip being mounted on said first surface of said substrate; and
    a thermally conductive structure including an open portion and substantially covering at least said outer surface of said semiconductor chip such that said chip is positioned substantially within said open portion, said structure being of a different material than said substrate while having substantially the same coefficient of thermal expansion as said substrate, said structure being bonded to said first surface of said substrate and including a plurality of openings therein, said openings filled with resin material.

2. The electronic package of claim 1 wherein said structure substantially covers said first surface of said substrate.

3. The electronic package of claim 1 wherein said structure is comprised of metal and is in the form of a film, sheet, mesh, or linear member.

4. The invention according to claim 1 wherein said electronic package is a ball grid array module.

5. An electronic package comprising:
    an organic substrate having a first surface;
    a semiconductor chip having an outer surface and mounted on said first surface of said substrate; and
    a structure including an open portion and substantially covering at least said outer surface of said semiconductor chip such that said chip is positioned substantially within said open portion, said structure being of the same material as said substrate and thereby having the same coefficient of thermal expansion as said substrate, said structure being bonded to said first surface of said substrate and including a plurality of openings therein, said openings filled with resin material.

6. The electronic package of claim 5 wherein said structure substantially covers said first surface of said substrate.

7. The electronic package of claim 5 wherein structure is a composite material of film, sheet, mesh, linear member, or powder.

8. The invention according to claim 5 wherein said electronic package is a ball grid array module.

9. An electronic package comprising:
    an organic substrate having a first surface;
    a semiconductor chip having an outer surface and mounted on said first surface of said substrate; and
    a structure positioned only on the areas of said first surface of said substrate substantially surrounding said chip and not over said chip, said structure being of a different material than said substrate and having substantially the same coefficient of thermal expansion as said substrate, said structure being bonded to said areas of said first surface of said substrate substantially surrounding said chip.

10. The electronic package of claim 9 wherein said structure is comprised of metal and is in the form of a film, sheet, mesh, or linear member.

11. The invention according to claim 9 wherein said electronic package is a ball grid array module.

12. An electronic package comprising:
    an organic substrate having a first surface;
    a semiconductor chip having an outer surface and mounted on said first surface of said substrate; and
    a structure positioned only on the areas of said first surface of said substrate substantially surrounding said chip and not over said chip, said structure being of the same material as said substrate and having substantially the same coefficient of thermal expansion as said substrate, said structure being bonded to said areas of said first surface of said substrate substantially surrounding said chip.

13. The electronic package of claim 12 wherein said structure is in the form of a film, sheet, mesh, or linear member.

14. The invention according to claim 12 wherein said electronic package is a ball grid array module.

* * * * *